(12) United States Patent
Li et al.

(10) Patent No.: US 10,343,383 B2
(45) Date of Patent: Jul. 9, 2019

(54) THERMOSETTING RESIN COMPOSITION AND PREPREG AND LAMINATED BOARD PREPARED THEREFROM

(71) Applicant: Shengyi Technology Co., Ltd., Guangdong (CN)

(72) Inventors: Hui Li, Guangdong (CN); Kehong Fang, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 181 days.

(21) Appl. No.: 15/525,665

(22) PCT Filed: Dec. 2, 2014

(86) PCT No.: PCT/CN2014/092839
§ 371 (c)(1),
(2) Date: May 10, 2017

(87) PCT Pub. No.: WO2016/074288
PCT Pub. Date: May 19, 2016

(65) Prior Publication Data
US 2017/0253013 A1 Sep. 7, 2017

(30) Foreign Application Priority Data
Nov. 11, 2014 (CN) .......................... 2014 1 0633141

(51) Int. Cl.

| | |
|---|---|
| B32B 27/38 | (2006.01) |
| B32B 27/26 | (2006.01) |
| B32B 27/20 | (2006.01) |
| B32B 27/18 | (2006.01) |
| B32B 27/04 | (2006.01) |
| B32B 15/092 | (2006.01) |
| C08G 59/32 | (2006.01) |
| C08G 59/38 | (2006.01) |
| C08G 59/42 | (2006.01) |
| C08G 59/68 | (2006.01) |
| C08L 63/00 | (2006.01) |
| C08J 5/24 | (2006.01) |
| H05K 1/03 | (2006.01) |
| B32B 27/28 | (2006.01) |
| B32B 27/30 | (2006.01) |
| C08J 5/04 | (2006.01) |
| C08L 79/04 | (2006.01) |
| C08G 73/06 | (2006.01) |
| C08G 61/02 | (2006.01) |
| C08L 61/14 | (2006.01) |
| H05K 1/02 | (2006.01) |

(52) U.S. Cl.
CPC .............. *B32B 27/38* (2013.01); *B32B 27/04* (2013.01); *B32B 27/285* (2013.01); *B32B 27/302* (2013.01); *C08G 59/3218* (2013.01); *C08G 61/02* (2013.01); *C08G 73/065* (2013.01); *C08J 5/043* (2013.01); *C08J 5/24* (2013.01); *C08L 61/14* (2013.01); *C08L 63/00* (2013.01); *C08L 79/04* (2013.01); *H05K 1/03* (2013.01); *H05K 1/0373* (2013.01); *B32B 2260/046* (2013.01); *B32B 2307/306* (2013.01); *B32B 2371/00* (2013.01); *B32B 2457/08* (2013.01); *C08J 2363/00* (2013.01); *C08J 2371/12* (2013.01); *C08J 2379/04* (2013.01); *C08J 2425/08* (2013.01); *C08J 2435/06* (2013.01); *C08J 2463/00* (2013.01); *C08J 2471/10* (2013.01); *C08J 2471/12* (2013.01); *C08L 2201/02* (2013.01); *C08L 2203/20* (2013.01); *C08L 2205/035* (2013.01); *H05K 1/024* (2013.01); *H05K 2201/012* (2013.01); *H05K 2201/0209* (2013.01)

(58) Field of Classification Search
None
See application file for complete search history.

(56) References Cited

U.S. PATENT DOCUMENTS

| | | | |
|---|---|---|---|
| 9,193,858 B2 | 11/2015 | Su et al. | |
| 2010/0218982 A1 | 9/2010 | Fujiwara et al. | |
| 2011/0092640 A1* | 4/2011 | Tzou | C08G 59/4261 524/600 |
| 2011/0139496 A1* | 6/2011 | Nakamura | B32B 7/12 174/256 |
| 2013/0075138 A1* | 3/2013 | Yu | C08K 5/5399 174/257 |
| 2014/0107256 A1 | 4/2014 | Su et al. | |
| 2015/0189747 A1 | 7/2015 | Zeng et al. | |
| 2015/0359093 A1 | 12/2015 | Fujiwara et al. | |

FOREIGN PATENT DOCUMENTS

| | | |
|---|---|---|
| CN | 101796132 A | 8/2010 |
| CN | 102585480 A | 7/2012 |

(Continued)

OTHER PUBLICATIONS

International Search Report issued in PCT?CN2014/092839 dated Aug. 17, 2015.

*Primary Examiner* — Michael J Feely
(74) *Attorney, Agent, or Firm* — Norton Rose Fulbright US LLP

(57) ABSTRACT

A thermosetting resin composition and a prepreg and a laminated board prepared therefrom. The thermosetting resin composition contains the following components in parts by weight: 50-150 parts of a cyanate; 30-100 parts of an epoxy resin; 5-70 parts of styrene-maleic anhydride; 20-100 parts of a polyphenyl ether; 30-100 parts of a halogen-free flame retardant; 0.05-5 parts of a curing accelerator; and 50-200 parts of a filler. The prepreg and laminated board prepared from the thermosetting resin composition have comprehensive performances such as a low dielectric constant, a low dielectric loss, an excellent flame retardance, heat resistance and moisture resistance, etc., and are suitable for use in a halogen-free high-frequency multilayer circuit board.

16 Claims, No Drawings

(56) References Cited

FOREIGN PATENT DOCUMENTS

| | | |
|---|---|---|
| CN | 102942684 A | 2/2013 |
| CN | 102964775 A | 3/2013 |
| CN | 103013110 A | 4/2013 |
| CN | 103351581 A | 10/2013 |
| CN | 103421273 A | 12/2013 |
| CN | 103709747 A | 4/2014 |
| TW | I297346 B | 6/2008 |
| WO | 2014036711 A1 | 3/2014 |

\* cited by examiner

THERMOSETTING RESIN COMPOSITION AND PREPREG AND LAMINATED BOARD PREPARED THEREFROM

This application is a § 371 of International Application No. PCT/CN2014/092839 filed on Dec. 2, 2014, and claims priority from Chinese Patent Application No. 201410633141.7, filed on Nov. 11, 2014.

TECHNICAL FIELD

The present invention relates to the technical field of laminates, specifically involves a resin composition, especially a thermosetting resin composition and a prepreg, a laminate and a printed circuit board prepared therefrom.

BACKGROUND ART

With the rapid development of the electronics industry, electronic products tend to be light, thin, short, high density, security and high functionality, requiring electronic components to have higher signal transmission speed and transmission efficiency, which makes higher performance requirements on the printed circuit board as the carrier. Due to high speed and multi-functionalization of electronic product information processing, the application frequency is continually increased, and 3 GHz or more will gradually become mainstream, therefore, besides maintaining the higher requirements on heat resistance of laminate materials, dielectric constant and dielectric loss value will be required to be lower and lower.

The current traditional FR-4 is difficult to meet the application demand on high frequency and rapid development of electronic products. Meanwhile, the substrate material no longer plays the traditional mechanical support role, and will become together with the electronic components an important way to improve product performances for PCB and designers of terminal manufacturers.

Because high Dk will slow down the signal transmission rate, and high Df will convert the signal partly into heat loss in the substrate material, high-frequency transmission with low dielectric constant and low dielectric loss, especially the development of halogen-free high-frequency plates, has become the focus of copper clad laminate industry.

At present, halogen-containing flame retardants (especially brominated flame retardants) are widely used in polymer flame retardant materials, and play a better flame retardant effect. However, it is concluded after the in-depth study of the fire scene that, although the halogen-containing flame retardant has a better flame retardant effect and a small addition amount, the polymer material containing the halogen-containing flame retardant will produce a lot of toxic and corrosive gas and smoke which suffocate people, thereby being more harmful than the fire itself. As a result, the development of the halogen-free flame retardant printed circuit boards has become a key point in the industry with the formal implementations of the EU Waste Electrical and Electronic Equipment Directive and the Restriction of the Use of Certain Hazardous Substances in Electrical and Electronic Equipment on Jul. 1, 2006. The CCL manufacturers have launched their own halogen-free flame retardant copper clad laminate.

In order to solve the above-mentioned problems, CN101796132B discloses a composition comprising an epoxy resin, a low molecular weight phenol-modified polyphenylene ether and a cyanate. Such epoxy resin composition has excellent dielectric properties, and is capable of maintaining flame retardancy and has high heat resistance. However, brominated flame retardant is used in the epoxy composition for flame retardancy. Although such composition has excellent comprehensive performance, the flame retardant containing bromine component are easy to cause environmental pollution during the product manufacture, use or even recovery or disposal, and are hard to meet the requirements of the environmental protection.

CN103013110A discloses a cured product comprising a cyanate, styrene-maleic anhydride, a polyphenylene ether, and bismaleimide, and the use of phosphorus-nitrogen compound as flame retardant can achieve low dielectric constant, low dielectric loss, high heat resistance and high flame resistance. However, bismaleimide has a high curing temperature, and the cured product is more brittle, resulting in many deficiencies during the processing and use.

Therefore, it is an urgent problem to be solved how to produce a prepreg and laminate having low dielectric constant, low dielectric loss and excellent chemical resistance.

DISCLOSURE OF THE INVENTION

The present invention aims to provide a resin composition, especially a thermosetting resin composition and a prepreg, a laminate and a printed circuit board prepared therefrom.

In order to achieve the object, the present invention uses the following technical solution.

On one aspect, the present invention provides a thermosetting resin composition comprising the following components in parts by weight: 50-150 parts of a cyanate, 30-100 parts of an epoxy resin, 5-70 parts of styrene-maleic anhydride, 20-100 parts of a polyphenyl ether, 30-100 parts of a halogen-free flame retardant, 0.05-5 parts of a curing accelerator, and 50-200 parts of a filler.

The epoxy resin of the present invention at least comprises an epoxy resin having the dicyclopentadiene alkyl structure as shown in the following chemical structural formula:

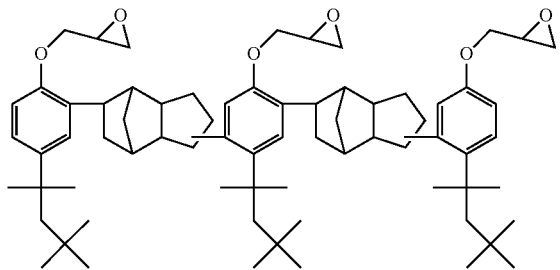

Besides comprising the epoxy resin having the structure above, said epoxy resin is also anyone selected from the group consisting of bisphenol A type epoxy resin, bisphenol F type epoxy resin, biphenyl epoxy resin, alkyl novolac epoxy resin, dicyclopentadiene epoxy resin, bisphenol A type novolac epoxy resin, o-cresol type novolac epoxy resin, phenol type novolac epoxy resin, trifunctional epoxy resin, tetrafunctional epoxy resin, isocyanate modified epoxy resin, naphthalene type epoxy resin and phosphorus-containing epoxy resin, or a mixture of at least two selected therefrom.

In the present invention, the epoxy resin is in an amount of 30-100 parts by weight, e.g. 30, 35, 40, 45, 50, 55, 60, 65, 70, 75, 80, 85, 90, 95, 100 parts by weight.

Due to the introduction of the epoxy resin, the thermosetting resin composition of the present invention can greatly improve the processability. The epoxy resin composition contains an epoxy resin having a dicyclopentadiene alkyl structure. The highly symmetrical and large volume structure of the dicyclopentadiene structure is helpful to reduce the dielectric properties of the substrate. At the same time, the nonpolarity and hydrophobicity of the alkyl structure can not only further optimize the dielectric properties, but also greatly reduce the water absorption of the substrate.

The cyanate in the present invention is at least one selected from the group consisting of the following chemical structures:

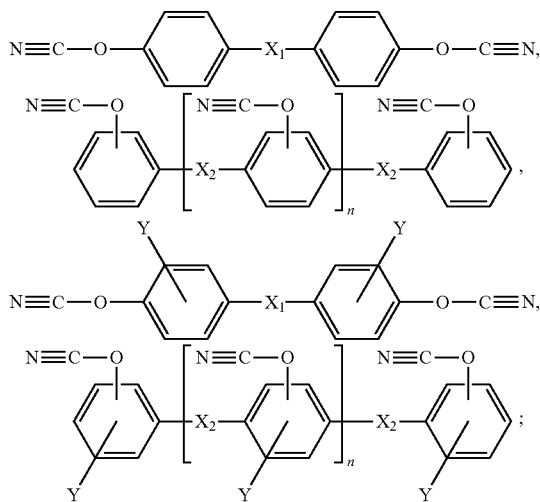

wherein $X_1$ and $X_2$ are each independently selected from at least one of R, Ar, $SO_2$ and O; R is selected from the group consisting of $-C(CH_3)_2-$, $-CH(CH_3)-$, $-CH_2-$ and substituted or unsubstituted dicyclopentadienyl; Ar is anyone selected from the group consisting of substituted or unsubstituted benzene, biphenyl, naphthalene, phenolic aldehyde, bisphenol A, bisphenol A phenolic aldehyde, bisphenol F and bisphenol F phenolic aldehyde; n is an integer of greater than or equal to 1; Y is an aliphatic functional group or aromatic functional group.

In the present invention, said cyanate is in an amount of 50-150 parts by weight, e.g. 50, 60, 65, 70, 75, 80, 85, 90, 95, 100, 105, 110, 115, 120, 125, 130, 135, 140, 145, or 150 parts by weight.

By adding cyanate, the thermosetting resin composition of the present invention can notably increase the heat resistance and dielectric properties of the system.

The styrene-maleic anhydride of the present invention has the chemical structure of

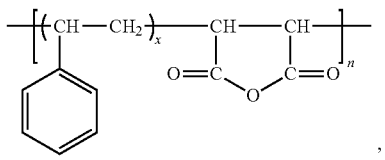

wherein x is 1-4, 6 and 8; n is 1-12; x and n both are integers.

In the present invention, said styrene-maleic anhydride is in an amount of 50-70 parts by weight, e.g. 5, 10, 15, 20, 25, 30, 35, 40, 45, 50, 55, 60, 65, or 70 parts by weight.

In the present invention, said polyphenyl ether has a low molecular weight and has a number-average molecular weight of 1000-4000.

In the present invention, said polyphenyl ether is in an amount of 20-100 parts by weight, e.g. 20, 25, 30, 35, 40, 45, 50, 55, 60, 65, 70, 75, 80, 85, 90, 95, or 100 parts by weight.

By adding polyphenylene ether, the thermosetting resin composition of the present invention can greatly reduce the dielectric constant and dielectric loss of the plate. In addition, the use of polyphenylene ether can improve the toughness of the plate and have positive influence on the use of the plate in the high-frequency multilayer circuit board.

The halogen-free flame retardant of the present invention is anyone selected from the group consisting of phosphazene, ammonium polyphosphate, tri-(2-carboxyethyl)-phosphine, tri-(isopropylchloro)phosphate, trimethyl phosphate, dimethyl-methyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide and DOPO-containing novolac resin, or a mixture of at least two selected therefrom.

In the present invention, said halogen-free flame retardant is in an amount of 30-100 parts by weight, e.g. 30, 35, 40, 45, 50, 60, 70, 80, 90, or 100 parts by weight.

The curing accelerator of the present invention is anyone selected from the group consisting of imidazoles, metal salts, tertiary amines or piperidine compounds, or a mixture of at least two selected therefrom.

Preferably, said curing accelerator is anyone selected from the group consisting of 2-methylimidazole, undecyl imidazole, 2-ethyl-4-methylimidazole, 2-phenyl-imidazole, 1-cyanoethyl substituted imidazole, benzyldimethylamine, cobalt acetylacetonate, copper acetylacetonate and zinc isooctanoate, or a mixture of at least two selected therefrom.

In the present invention, said curing accelerator is in an amount of 0.05-5 parts by weight, e.g. 0.05, 1, 1.5, 2, 2.5, 3, 3.5, 4, 4.5, or 5 parts by weight.

Preferably, said filler is an inorganic or organic filler.

Preferably, said filler is an inorganic filler, which is anyone selected from the group consisting of aluminum hydroxide, alumina, magnesium hydroxide, magnesium oxide, aluminum oxide, silicon dioxide, calcium carbonate, aluminum nitride, boron nitride, silicon carbide, titanium dioxide, zinc oxide, zirconium oxide, mica, boehmite, calcined talc, talc powder, silicon nitride and calcined kaolin, or a mixture of at least two selected therefrom.

Preferably, said filler is an organic filler, which is anyone selected from the group consisting of polytetrafluoroethylene powder, polyphenylene sulfide and polyethersulfone powder, or a mixture of at least two selected therefrom.

Preferably, said filler has a particle size of 0.01-50 μm, e.g. 0.01 μm, 0.05 μm, 1 μm, 5 μm, 10 μm, 15 μm, 20 μm, 25 μm, 30 μm, 40 μm, 50 μm, preferably 1-15 μm, further preferably 1-5 μm.

In order to homogeneously disperse the filler in the resin composition of the present invention, a dispersant may be added in the form of an aminosilane coupling agent or an epoxy silane coupling agent to improve the binding performance between inorganic and woven glass cloth, so as to achieve the purpose of homogeneous dispersion. Moreover, such coupling agent contains no heavy metal, and will not have adverse effects on human bodies. Such coupling agent is in an amount of 0.5-2 wt. % of the inorganic filler. If the amount thereof is too high, it will speed up the reaction and affect the storage time. If the amount thereof is too small, there is no significant effect on the improvement of the bonding stability.

On the second aspect, the present invention provides a prepreg prepared from the thermosetting resin composition as stated in the first aspect of the present invention, wherein said prepreg comprises a matrix material, and the thermosetting resin composition attached thereon after impregnation and drying.

The matrix material of the present invention is a non-woven or woven glass fiber cloth.

On the third aspect, the present invention further provides a laminate comprising the prepreg as stated in the second aspect of the present invention.

On the fourth aspect, the present invention further provides a printed circuit board comprising the laminate as stated in the third aspect of the present invention.

As compared to the prior art, the present invention has the following beneficial effects.

The prepreg and the laminate prepared from the thermosetting resin composition of the present invention have a low dielectric constant which can be controlled below 3.6 and a low dielectric loss which is between 0.0041 and 0.0044, and have excellent flame retardancy, heat resistance, moisture resistance and other comprehensive properties. The flame retardancy thereof can reach the V-0 standard in the flame retardant test UL-94, and the PCT water absorption thereof is 0.28-0.32. They are suitable for the use in halogen-free high-frequency multi-layer circuit boards.

EMBODIMENTS

The technical solution of the present invention will be further described below by the specific embodiments.

Those skilled in the art shall know that the examples are merely illustrative of the present invention and should not be construed as specifically limiting the present invention.

Preparation Example: Synthesis of Dicyclopentadiene Alkyl Phenol Epoxy Resin 270.0 g of p-(1,1,3,3-tetramethyl)butylphenol was added into a four-necked flask (500 mL) equipped with a polytetrafluoroethylene stirrer, a thermometer and a reflux condenser, heated and dissolved in water bath. 1.83 g of boron trifluoride.diethyl ether was added into the 500 mL four-necked flask, and 50.1 g of dicyclopentadiene was added to a dropping funnel to control the dropping speed so that all the dicyclopentadiene was added dropwise within 2 h. The mixture was heated to 100° C., held for 4 h, cooled to room temperature, and then heated to a certain temperature to distill excess dicyclopentadiene and p-(1,1,3,3-tetramethyl) butylphenol. The product is dicyclopentadiene alkyl phenol resin.

The dicyclopentadiene alkyl phenol resin obtained in the previous step was placed in a four-necked flask. 100.0 g of epichlorohydrin was weighed, added slowly, dissolved and heated. 1 mol of KOH solution having a mass fraction of 33% was added to a dropping funnel, added dropwise within 1 h by controlling the speed. The reaction temperature was controlled at 100° C. After adding dropwise, the temperature was held for 4 h. After cooling, water-washing, heating to 120° C., excessive epichlorohydrin was distilled to obtain the dicyclopentadiene alkyl phenol epoxy resin as shown in the following chemical formula:

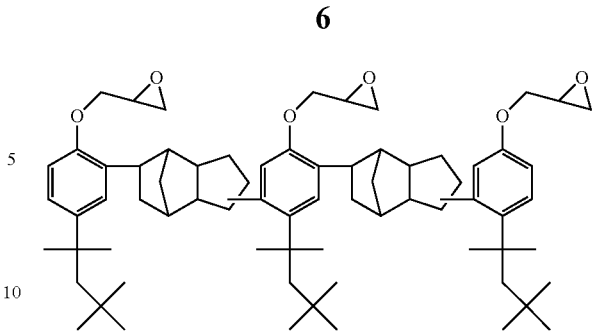

Examples Process for Preparing Copper Clad Laminates

A cyanate, an epoxy resin, styrene-maleic anhydride, a polyphenylene ether, a halogen-free flame retardant, a curing accelerator, a filler and a solvent were put into a container and stirred to make the mixture uniformly into a glue. The solid content of the solution was adjusted to 60%-70% with the solvent to obtain a glue solution, i.e. a thermosetting resin composition glue solution. A 2116 electronic grade glass cloth was impregnated with the glue, baked into a prepreg by an oven. 6 pieces of 2116 prepregs were covered with electrolytic copper foils having a thickness of 35 μm on both sides, vacuum-laminated in a hot press, cured at 190° C. for 120 min to obtain copper clad laminates.

The components and contents thereof (based on parts by weight) in Examples 1-6 and Comparison Examples 1-5 are shown in Table 1. The component codes and the corresponding component names are shown as follows.

(A) Cyanate: HF-10 (Product name from Shanghai Hui Feng trading)

(B) Epoxy resin (B-1) Dicyclopentadiene alkyl phenol epoxy resin synthesized in the preparation example (B-2) Biphenyl epoxy resin: NC-3000-H (Product name from Nippon Kayaku);

(B-3) Dicyclopentadiene epoxy resin: HP-7200H (Product name from Dainippon Ink and Chemicals)

(C) Styrene-maleic anhydride oligomer: SMA-EF40 (Product name from Sartomer);

(D-1) Polyphenyl ether having a low molecular weight: MX90 (Product name from SABIC Innovative Plastics) having a number-average molecular weight of 1000-4000;

(D-2) Polyphenyl ether having a high molecular weight: Sabic640-111 (Product name from SABIC Innovative Plastics) having a number-average molecular weight of 15000-20000;

(E) Halogen-free flame retardant;

(E-1) PX-200 (Product name from Daihachi Chemical Industry Co.);

(E-2) SPB-100 (Product name from Otsuka Chemical Co.);

(G) Curing accelerator;

(H) Filler: molten silica.

The processes for preparing CCLs in Examples 1-6 and Comparison Examples 1-5 are the same as those in the examples.

The glass transition temperature (Tg), peeling strength (PS), dielectric constant (Dk) and dielectric loss angle tangent (Tg), flame retardancy, dip soldering resistance and water absorption after PCT 2 h of the copper clad laminates prepared in Examples 1-6 and Comparison Examples 1-5 were tested by the following methods, and the test results are shown in Table 2.

The performance parameters are tested by the following methods.

A Glass transition temperature (Tg): tested according to the DSC method as stipulated under IPC-TM-650 2.4.25 in accordance with DSC;

B Peeling strength (PS): testing the peeling strength of the metal cover layer under the testing conditions of "after thermal stress" in the method of IPC-TM-650 2.4.8;

C Dielectric constant (Dk) and dielectric loss angle tangent (Df): testing dielectric constant (Dk) and dielectric loss angle tangent (Df) under 1 GHz by the resonance method using a stripe line according to IPC-TM-650 2.5.5.5;

D Flame retardancy: tested according to the UL-94 standard;

E Dip soldering resistance and water absorption after PCT 2 h:

The copper clad laminate was immersed in a copper etching solution to remove the surface copper foils, and to evaluate the substrate. The substrate was placed in a pressure cooker and treated at 121° C. and 2 atm for 2 hours. After the water absorption was measured, the substrate was immersed in a tin furnace having a temperature of 288° C. The corresponding time was recorded when the substrate is bubbled or split. The evaluation was finished when the substrate had no foaming or stratification in the tin furnace for more than 5 min.

It can be seen according to the data in Tables 1 and 2 that, (1) According to Examples 1-3, it can be seen that the PCT water absorptions in Examples 1-3 were 0.32, 0.31 and 0.28, respectively; the PCT water absorption in Example 3 was the lowest; it was found that, along with the increase of the content of epoxy resin (corresponding to Component B-1), the PCT water absorption of the substrate gradually decreased, so that its water absorption was significantly improved;

(2) As can be seen from Example 2 and Comparison Example 1, the dielectric constant, dielectric loss and PCT water absorption of Example 2 were all lower than those of Comparison Example 1; and it was found that a lower dielectric constant, a lower dielectric loss, and a lower PCT water absorption could be obtained by using dicyclopentadiene alkyl phenol epoxy resin synthesized according to the present invention in Example 2 as compared to biphenyl epoxy resin in Comparison Example 1;

(3) As can be seen from Example 3 and Comparison Example 2, the dielectric constant, dielectric loss and PCT water absorption of Example 3 were lower than those of Comparison Example 2; it was found that a lower dielectric constant, a lower dielectric loss, and a lower PCT water absorption could be obtained by using dicyclopentadiene alkyl phenol epoxy resin synthesized according to the present invention in Example 3 as compared to the commercial dicyclopentadiene epoxy resin in Comparison Example 2;

(4) It can be seen from Example 5, Example 6 and Comparison Example 3 that the components to be used should be controlled within certain weight ranges, so that the substrates had excellent overall properties; the

TABLE 1

|   | Example 1 | Example 2 | Example 3 | Example 4 | Example 5 | Example 6 | Comparison Example 1 | Comparison Example 2 | Comparison Example 3 | Comparison Example 4 | Comparison Example 5 |
|---|---|---|---|---|---|---|---|---|---|---|---|
| A | 100 | 100 | 100 | 100 | 50 | 150 | 100 | 100 | 100 | 100 | 100 |
| B-1 | 30 | 60 | 100 | 60 | 40 | 100 |  |  | 20 |  | 60 |
| B-2 |  |  |  | 20 |  |  | 60 |  |  | 60 |  |
| B-3 |  |  |  | 20 |  |  |  | 100 |  |  |  |
| C | 42 | 42 | 42 | 42 | 5 | 70 | 42 | 42 | 70 | 42 | 42 |
| D-1 | 50 | 50 | 50 | 50 | 20 | 100 | 50 | 50 | 50 |  |  |
| D-2 |  |  |  |  |  |  |  |  |  |  | 50 |
| E-1 | 20 | 20 | 20 | 20 |  | 36 | 20 | 20 | 20 | 20 | 20 |
| E-2 | 45 | 45 | 45 | 45 | 30 | 64 | 45 | 45 | 45 | 45 | 45 |
| G | q.s | q.s | q.s | q.s | q.s | q.s | q.s | q.s | q.s | q.s | q.s |
| H | 110 | 110 | 110 | 110 | 50 | 200 | 110 | 110 | 110 | 110 | 110 |

TABLE 2

| Test items | Example 1 | Example 2 | Example 3 | Example 4 | Example 5 | Example 6 | Comparison Example 1 | Comparison Example 2 | Comparison Example 3 | Comparison Example 4 | Comparison Example 5 |
|---|---|---|---|---|---|---|---|---|---|---|---|
| Tg(DSC) (° C.) | 187 | 189 | 184 | 186 | 185 | 188 | 190 | 187 | 193 | 190 | 187 |
| Peeling strength (N/mm) | 1.45 | 1.42 | 1.48 | 1.52 | 1.45 | 1.42 | 1.50 | 1.45 | 1.26 | 1.42 | 1.41 |
| Dielectric constant(1 GHz) | 3.6 | 3.6 | 3.6 | 3.6 | 3.6 | 3.6 | 3.8 | 3.8 | 3.7 | 3.9 | 3.7 |
| Dielectric loss (1 GHz) | 0.0041 | 0.0042 | 0.0042 | 0.0044 | 0.0043 | 0.0042 | 0.0052 | 0.0059 | 0.0042 | 0.0060 | 0.0045 |
| Combustibility | V-0 | V-0 | V-0 | V-0 | V-0 | V-0 | V-0 | V-0 | V-0 | V-0 | V-0 |
| PCT(min) | >5 | >5 | >5 | >5 | >5 | >5 | >5 | >5 | 3 | 3 | >5 |
| PCT water absorption | 0.32 | 0.31 | 0.28 | 0.30 | 0.29 | 0.31 | 0.35 | 0.34 | 0.35 | 0.35 | 0.35 |
| Processability | Better | Better | Better | Better | Better | Better | Better | Better | Better | Better | Worse | dielectric properties in Comparison Example 3 were almost the same as those in Examples 5 and 6, but Comparison Example 3 could not pass the 2 h PCT test; it can be seen that Comparison Example 3 would affect the 2 h PCT test of the substrate when using less than 30 parts by weight of epoxy resin;

(5) As can be seen from Example 2 and Comparison Example 4, the dielectric constant, dielectric loss and PCT water absorption in Example 2 were all lower than those in Comparison Example 4; Comparison Example 4 was not able to pass the 2-hour PCT test; it can be seen that the dielectric properties in Example 2 were remarkably improved after adding a polyphenyl ether having a low molecular weight as compared to Comparison Example 4 in which a polyphenyl ether having a low molecular weight was not added; moreover, Example 2 could pass the 2 h PCT test; by comparing Example 2 with Comparison Example 5, it can be found that, although their overall properties were equivalent, the use of a polyphenylene ether having a high molecular weight resulted in poor processability.

According to Examples 1 to 6, it was found that the laminates prepared by using the thermosetting resin composition of the present invention have a dielectric constant of 3.6 or less, a dielectric loss of 0.0041 to 0.0044, and have excellent flame retardancy, heat resistance, moisture resistance and other comprehensive performances. The flame retardancy thereof can reach the V-0 standard in the flame retardant test UL-94, and PCT water absorption is 0.28-0.32. Thus they are suitable for use in halogen-free high-frequency multilayer circuit boards.

In summary, the thermosetting resin composition of the present invention has a low dielectric constant, low dielectric loss, excellent heat resistance and cohesiveness while ensuring halogen-free flame retardancy, and is suitable for use in halogen-free high frequency multilayer circuit boards.

Certainly, the above-described examples are merely illustrative examples of the present invention and are not intended to limit the implement scope of the present invention. Therefore any equivalent changes or modifications according to the principles within the patent scope of the present invention are all included in the scope of the present patent.

The invention claimed is:

1. A thermosetting resin composition consisting of the following components in parts by weight: 50-150 parts of a cyanate, 30-100 parts of an epoxy resin, 5-70 parts of styrene-maleic anhydride, 20-100 parts of a polyphenyl ether, 30-100 parts of a halogen-free flame retardant, 0.05-5 parts of a curing accelerator, and 50-200 parts of a filler; wherein the polyphenyl ether has a number-average molecular weight of 1000-4000; and wherein the epoxy resin at least comprises an epoxy resin having the dicyclopentadiene alkyl structure as shown in the following chemical structural formula:

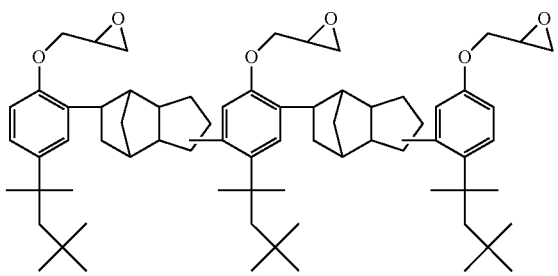

2. The thermosetting resin composition claimed in claim 1, wherein the cyanate is at least one selected from the group consisting of the following chemical structures:

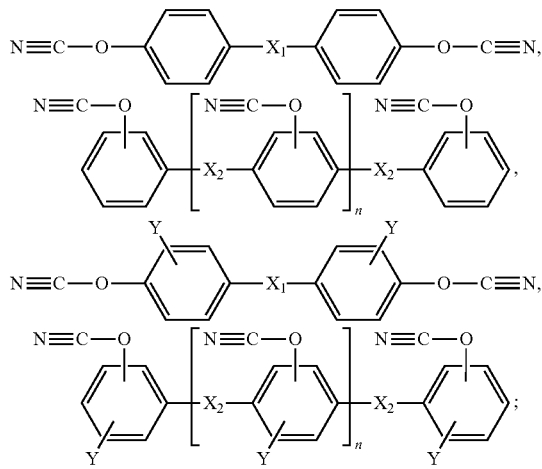

wherein $X_1$ and $X_2$ are each independently selected from at least one of R, Ar, $SO_2$ and O; R is selected from the group consisting of $-C(CH_3)_2-$, $-CH(CH_3)-$, $-CH_2-$ and substituted or unsubstituted dicyclopentadienyl; Ar is anyone selected from the group consisting of substituted or unsubstituted benzene, biphenyl, naphthalene, phenolic aldehyde, bisphenol A, bisphenol A phenolic aldehyde, bisphenol F and bisphenol F phenolic aldehyde; n is an integer of greater than or equal to 1; Y is an aliphatic functional group or aromatic functional group.

3. The thermosetting resin composition claimed in claim 1, wherein the styrene-maleic anhydride has the chemical structure of

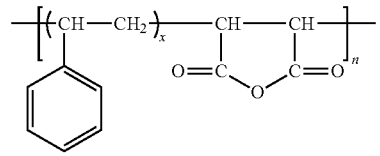

wherein x is 1-4, 6 or 8; n is 1-12; x and n both are integers.

4. The thermosetting resin composition claimed in claim 1, wherein the halogen-free flame retardant is anyone selected from the group consisting of phosphazene, ammonium polyphosphate, tri-(2-carboxyethyl)phosphine, tri-(isopropylchloro)phosphate, trimethyl phosphate, dimethylmethyl phosphate, resorcinol bis-xylyl phosphate, phosphorus-nitrogen compounds, melamine polyphosphate, melamine cyanurate, tri-hydroxyethyl isocyanurate, 9,10-dihydro-9-oxa-10-phosphaphenanthrene-10-oxide, DOPO-containing novolac resin, and a mixture of at least two selected therefrom.

5. The thermosetting resin composition claimed in claim 1, wherein the curing accelerator is anyone selected from the group consisting of imidazoles, metal salts, tertiary amines, piperidine compounds, and a mixture of at least two selected therefrom.

6. The thermosetting resin composition claimed in claim 1, wherein the curing accelerator is anyone selected from the group consisting of 2-methylimidazole, undecyl imidazole, 2-ethyl-4-methylimidazole, 2-phenyl-imidazole, 1-cyanoethyl substituted imidazole, benzyldimethylamine, cobalt acetylacetonate, copper acetylacetonate, zinc isooctanoate, and a mixture of at least two selected therefrom.

7. The thermosetting resin composition claimed in claim 1, wherein the filler is an inorganic or organic filler.

8. The thermosetting resin composition claimed in claim 1, wherein the filler is an inorganic filler, which is anyone selected from the group consisting of aluminum hydroxide, alumina, magnesium hydroxide, magnesium oxide, aluminum oxide, silicon dioxide, calcium carbonate, aluminum nitride, boron nitride, silicon carbide, titanium dioxide, zinc oxide, zirconium oxide, mica, boehmite, calcined talc, talc powder, silicon nitride, calcined kaolin, and a mixture of at least two selected therefrom.

9. The thermosetting resin composition claimed in claim 1, wherein the filler is an organic filler selected from the group consisting of polytetrafluoroethylene powder, polyphenylene sulfide, polyethersulfone powder, and a mixture of at least two selected therefrom.

10. The thermosetting resin composition claimed in claim 1, wherein the filler has a particle size of 0.01-50 μM.

11. A prepreg prepared from the thermosetting resin composition claimed in claim 1, wherein the prepreg comprises a matrix material, and the thermosetting resin composition attached thereon after impregnation and drying.

12. The prepreg claimed in claim 11, wherein the matrix material is a non-woven or woven glass fiber cloth.

13. A laminate comprising the prepreg claimed in claim 11.

14. A printed circuit board comprising the laminate claimed in claim 13.

15. A thermosetting resin composition consisting of the following components in parts by weight: 50-150 parts of a cyanate, 30-100 parts of an epoxy resin, 5-70 parts of styrene-maleic anhydride, 20-100 parts of a polyphenyl ether, 30-100 parts of a halogen-free flame retardant, 0.05-5 parts of a curing accelerator, and 50-200 parts of a filler; wherein the polyphenyl ether has a number-average molecular weight of 1000-4000;
the epoxy resin at least comprises a) an epoxy resin having the dicyclopentadiene alkyl structure as shown in the following chemical structural formula:

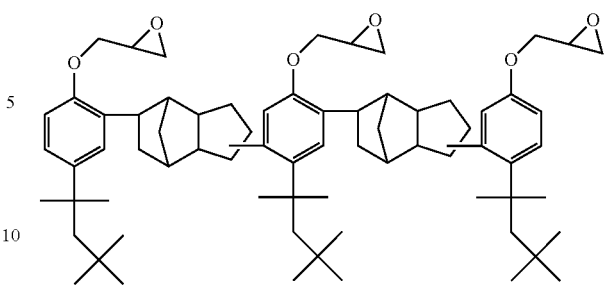

and b) a resin selected from the group consisting of bisphenol A type epoxy resin, bisphenol F type epoxy resin, biphenyl epoxy resin, alkyl novolac epoxy resin, dicyclopentadiene epoxy resin, bisphenol A type novolac epoxy resin, o-cresol type novolac epoxy resin, phenol type novolac epoxy resin, trifunctional epoxy resin, tetrafunctional epoxy resin, isocyanate modified epoxy resin, naphthalene type epoxy resin, phosphorus-containing epoxy resin, and a mixture of at least two selected therefrom.

16. The thermosetting resin composition claimed in claim 15, wherein the styrene-maleic anhydride has the chemical structure of

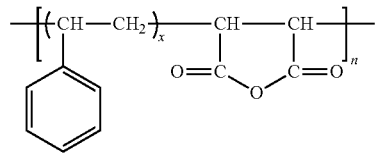

wherein x is 1-4, 6 or 8; n is 1-12; x and n both are integers.

* * * * *